(12) United States Patent
Johnson

(10) Patent No.: US 7,508,886 B2
(45) Date of Patent: Mar. 24, 2009

(54) SYSTEM FOR GENERATING A DIGITAL SIGNAL

(75) Inventor: J. Andrew Johnson, Owego, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 561 days.

(21) Appl. No.: 11/092,485

(22) Filed: Mar. 29, 2005

(65) Prior Publication Data

US 2006/0222111 A1    Oct. 5, 2006

(51) Int. Cl.
    *H04L 25/08* (2006.01)
(52) U.S. Cl. .................. 375/296; 375/226; 375/346
(58) Field of Classification Search ................ 375/139, 375/340
    See application file for complete search history.

(56) References Cited

U.S. PATENT DOCUMENTS

| | | | |
|---|---|---|---|
| 4,090,145 A | 5/1978 | Webb | |
| 4,203,002 A | 5/1980 | Nossen | |
| 4,225,937 A | 9/1980 | Perreault et al. | |
| 4,524,326 A | 6/1985 | Larson | |
| 4,612,545 A | 9/1986 | Asendorf et al. | |
| 4,839,842 A | 6/1989 | Pyi et al. | |
| 4,882,526 A | 11/1989 | Iino et al. | |
| 4,890,055 A | 12/1989 | Van Broekhoven et al. | |
| 5,117,377 A | 5/1992 | Finman | |
| 5,206,601 A | 4/1993 | Ready | |
| 5,253,192 A | 10/1993 | Tufts | |
| 5,504,455 A * | 4/1996 | Inkol | 329/304 |
| 5,615,139 A | 3/1997 | Asghar et al. | |
| 5,675,609 A | 10/1997 | Johnson | |
| 5,808,895 A | 9/1998 | Ibrahim et al. | |
| 5,832,414 A | 11/1998 | Hart et al. | |
| 5,878,091 A | 3/1999 | Retzer | |
| 6,085,077 A | 7/2000 | Fields et al. | |
| 6,202,075 B1 | 3/2001 | Azadet | |
| 6,351,664 B1 | 2/2002 | Brodnick | |
| 6,366,629 B1 | 4/2002 | Chen et al. | |
| 6,366,864 B1 | 4/2002 | Kulidjian et al. | |
| 6,393,073 B1 | 5/2002 | Eilts | |

(Continued)

FOREIGN PATENT DOCUMENTS

GB    2250648 A    6/1992

(Continued)

OTHER PUBLICATIONS

Smith, J.O. "Fourier Theorems for the DFT", in Mathematics of the Discrete Fourier Transform (DFT), http://web.archive.org/web/20040803094805/http://ccrma.stanford.edu/~jos/mdft/Analytic_Signals_Hilbert_Transform.html, 2003.*

*Primary Examiner*—Shuwang Liu
*Assistant Examiner*—David Huang
(74) *Attorney, Agent, or Firm*—Tarolli, Sundheim, Covell & Tummino LLP

(57) ABSTRACT

A system generates a digital signal from input data of a digital pulse. The system includes a converter, a generator, and a comparator. The converter converts the digital pulse to an analytic signal. The converter produces a first output by application of an amplitude envelope and Euler's identity. The generator generates an analog signal from the first output. The generator produces a second output. The comparator compares the second output to the input data of the digital pulse.

5 Claims, 2 Drawing Sheets

U.S. PATENT DOCUMENTS

| | | |
|---|---|---|
| 6,411,977 B1 | 6/2002 | Bargauan |
| 6,418,158 B1 * | 7/2002 | Vishwanath et al. ........ 375/139 |
| 6,504,876 B1 | 1/2003 | Suto |
| 6,549,594 B1 | 4/2003 | Chen et al. |
| 6,600,382 B1 | 7/2003 | Klymyshyn |
| 6,628,697 B1 * | 9/2003 | Douglas et al. ............. 375/139 |
| 2002/0093641 A1 * | 7/2002 | Ortyn et al. .................. 356/28 |
| 2003/0018442 A1 * | 1/2003 | Yamaguchi et al. ........... 702/69 |
| 2003/0154042 A1 | 8/2003 | Waldner |
| 2004/0062301 A1 * | 4/2004 | Yamaguchi et al. ......... 375/226 |

FOREIGN PATENT DOCUMENTS

| | | |
|---|---|---|
| JP | 57196167 A | 12/1982 |

* cited by examiner

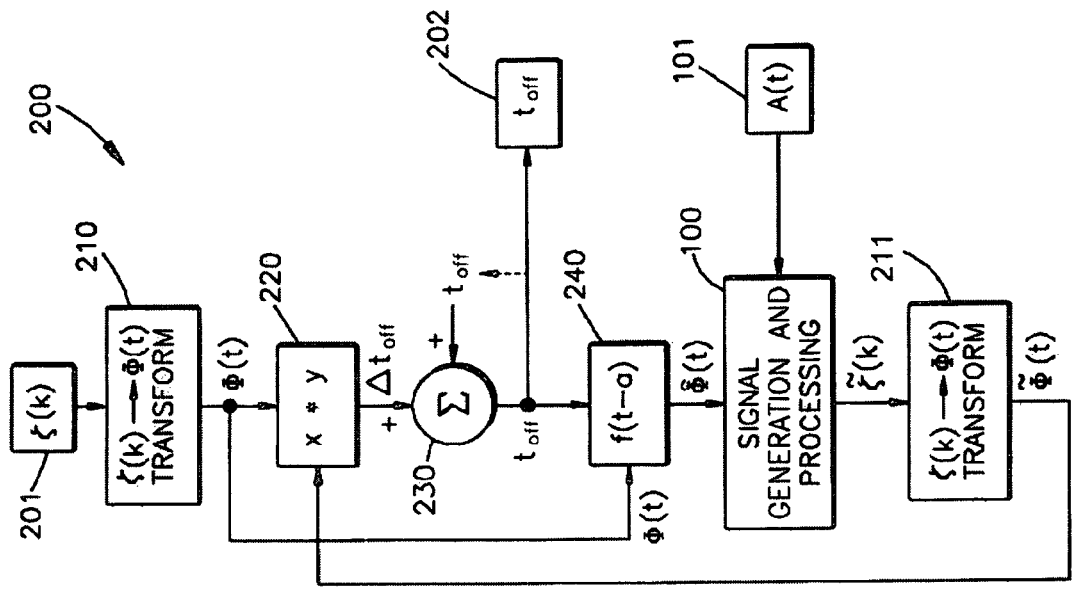
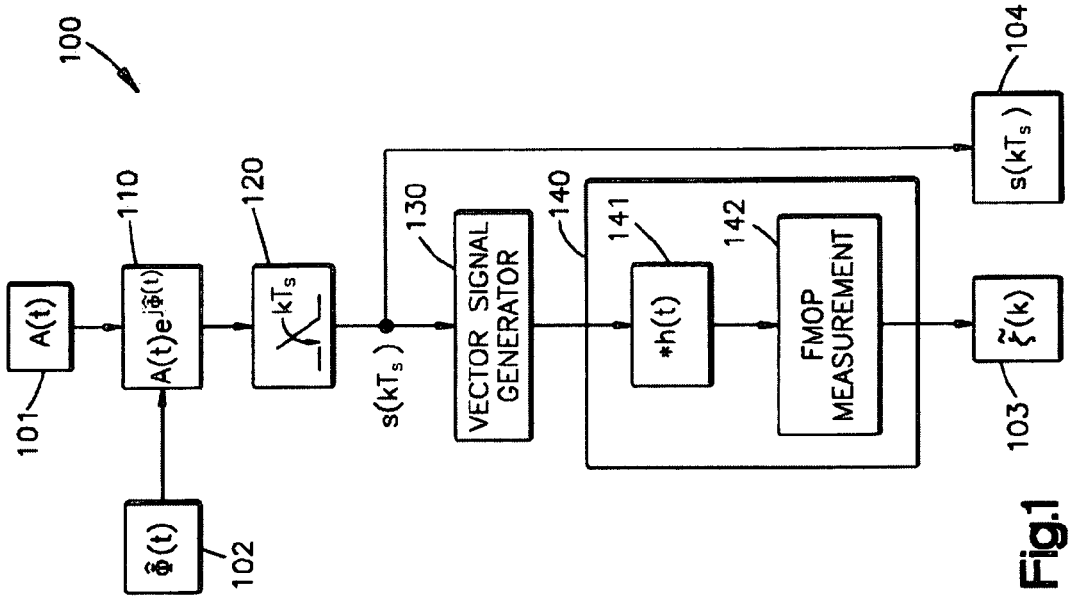

SYSTEM FOR GENERATING A DIGITAL SIGNAL

FEDERAL SPONSORSHIP

The U.S. Government has a paid-up license in this invention and the right, in limited circumstances, to require the patent owner to license others on reasonable terms as provided for by the terms of Contract No. N00019-00-G-0425 awarded by the U.S. Navy.

FIELD OF INVENTION

The present invention is directed to a system for generating a digital signal, and more particularly, to a system for adaptively generating a digital signal representing a FMOP sequence.

BACKGROUND OF THE INVENTION

A conventional technique transforms a time-ordered Frequency Modulation on Pulse (FMOP) sequence into an analytic signal with particular FMOP properties. However, once this conventional transformation is complete, the analytic signal may no longer have certain desired properties. Since the conventional transformation may involve approximations, the resultant signal may have somewhat different FMOP properties than the original input FMOP sequence.

The hardware device utilized by the conventional transformation may imperfectly convert the digital signal samples to analog signals. A system that processes the conventionally transformed signal may have a non-unity transfer function. The measurement method utilized by the conventional technique to measure the FMOP output may be imperfect.

A system for removing these perturbations by indirect measurement so that the transformed signal has the desired relevant FMOP properties is desirable.

SUMMARY OF THE INVENTION

A system in accordance with the present invention generates a digital signal from input data of a digital pulse. The system includes a converter, a generator, and a comparator. The converter converts the digital pulse to an analytic signal. The converter produces a first output by application of an amplitude envelope and Euler's identity. The generator generates an analog signal from the first output. The generator produces a second output. The comparator compares the second output to the input data of the digital pulse.

A method in accordance with the present invention generates a digital signal from input data of a digital pulse. The method includes the following steps:

converting the digital pulse to an analytic signal thereby producing a first output by application of an amplitude envelope and Euler's identity; generating an analog signal from the first output thereby producing a second output; and comparing the second output to the input data of the digital pulse.

A computer program product in accordance with the present invention generates a digital signal from input data of a digital pulse. The computer program product includes the following instructions: a first instruction for converting the digital pulse to an analytic signal thereby producing a first output by application of an amplitude envelope and Euler's identity; a second instruction for generating an analog signal from the first output thereby producing a second output; a third instruction for comparing the second output to the input data of the digital pulse thereby producing a third output; a fourth instruction for estimating a time offset between the digital pulse and the second output; a fifth instruction for removing perturbations from the second output; a sixth instruction for refining the third output by applying an accumulator thereby producing a fourth output; and a seventh instruction for totaling errors causing the generated signal to be different than the digital pulse.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein:

FIG. 1 is a schematic representation of a system in accordance with the present invention;

FIG. 2 is a schematic representation of another system in accordance with the present invention.

DESCRIPTION OF AN EXAMPLE EMBODIMENT

Figure 3:
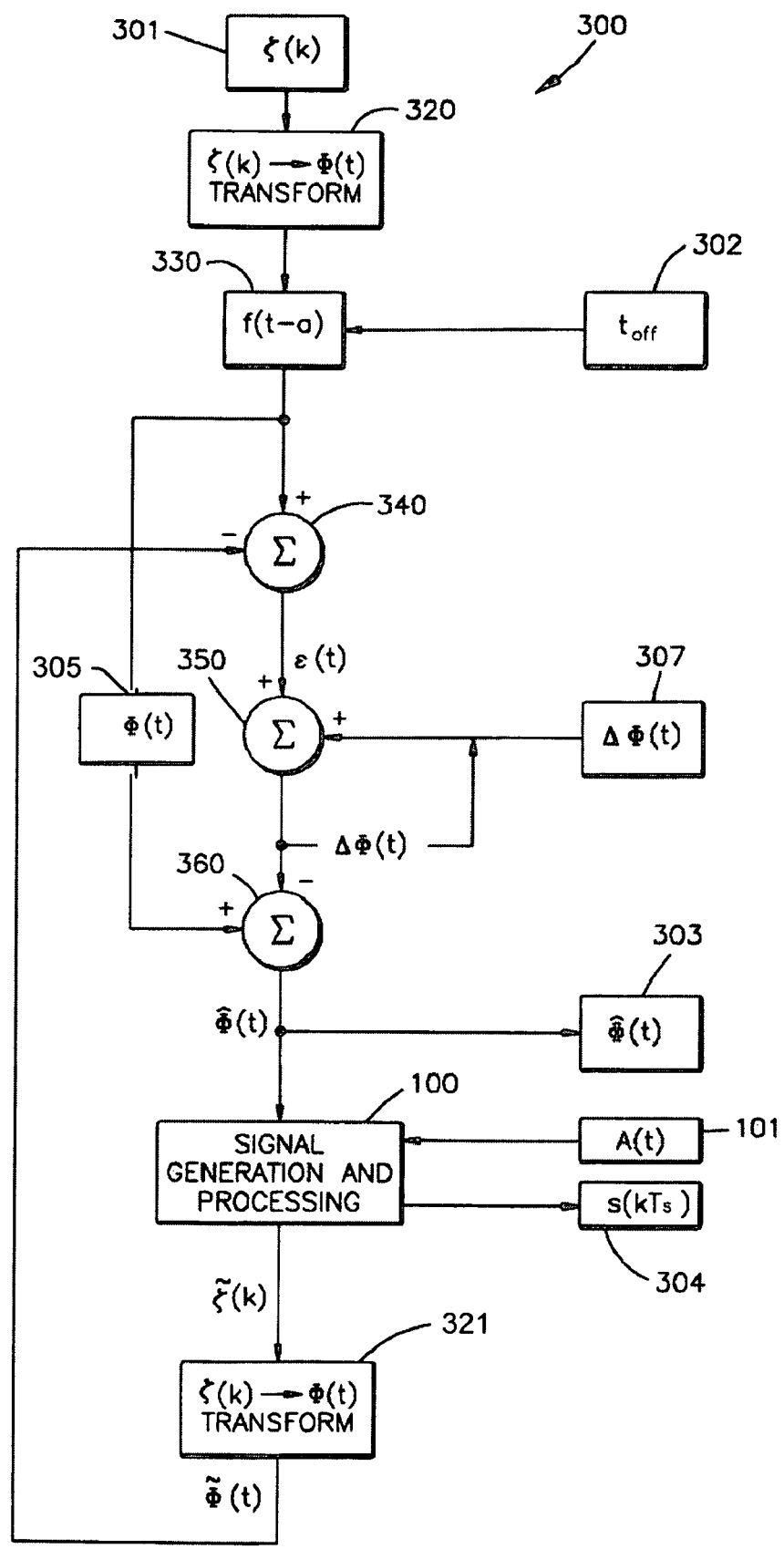
FIG. 3 is a schematic representation of still another system in accordance with the present invention.

A system in accordance with the present invention receives a Frequency Modulation on Pulse (FMOP) sequence as input. The system imposes a timing relationship between the FMOP sequence and the FMOP sequence's leading edge.

The system firstly may adjust a temporal position of the FMOP sequence by estimating a correct position. The system then may create a first signal based on that estimate and process the first signal utilizing the estimated temporal position. The system may also measure FMOP properties of the input sequence and transform these measurements into a second signal. The system may then compare the first signal with the second signal.

The system estimates the timing offset error by cross-correlation. The system may adjust the first signal to compensate. The system may repeat this procedure until a correct timing relationship is achieved.

A timing offset error may be only one part of an overall system perturbation. The system may use a similar technique to adjust the phase imposed on the input FMOP sequence until correct FMOP values are measured. As an improvement over the conventional techniques, the system in accordance with the present invention removes perturbations by indirect measurement thereby producing a signal having required FMOP properties.

As shown in FIG. 1, a system 100 in accordance with the present invention performs signal generation and processing. Box 101 represents a desired amplitude envelope for the generated signal. Many pulses are modeled as having a shape other than rectangular, for example, an exponential rise time. Box 102 represents a phase vs. time function to be encoded into the generated signal. In box 110, the system 100 generates an analytic (complex) signal based on Euler's identity, $Ae^{j\phi} = A\cos\phi + jA\sin\phi$. From box 110, the system 100 proceeds to box 120.

In box 120, the system 100 generates a continuous-time signal being sampled at uniformly spaced time intervals, based on the sample clock period used by a Vector Signal Generator to produce input signal samples $s(kT_s)$. From box 120, the system 100 outputs signal samples $s(kT_s)$ and also proceeds to box 130.

In box 130 (A Vector Signal Generator), the system 100 generates a modulated signal (typically Radio Frequency). From box 130, the system proceeds to box 140. Box 140 represents a physical processing system imparting some distortion to the signal (141) and making signal parametric measurements (142). In box 141, some unknown impulse response, h(t), may impart some distortion to the signal. From box 141, the system 100 proceeds to box 142. In box 142, the system 100 produces an estimate of FMOP vs. time. From box 142, the system 100 proceeds to box 103.

In box 103, the system 100 produces the measured FMOP vs. time sequence of estimates. k is a time measurement index. The time increment between measurements may vary. Box 104 represents the intermediate analytic (complex) signal samples, created as part of the signal generation process. These may be saved in a "library" to be used to generate the signal in lieu of $\hat{\phi}(t)$ and A(t). k is a time measurement index, with a time increment based on the sample clock period used by the Vector Signal Generator 130.

As shown in FIG. 2, a system 200 in accordance with the present invention performs estimation of time delay/offset. For a desired FMOP vs. time sequence, $\zeta(k)$, an estimate of the a system's time delay, $t_{off}$ may be computed. Correct time alignment is essential for later processing. The loop structure of the system 200 may be repeated until a suitable time delay is determined. For each loop, the accumulated time offset may be incrementally improved by small corrections.

Box 101 represents the desired amplitude envelope for the generated signal from the system 100. Box 201 represents a desired FMOP vs. time sequence, $\zeta(k)$. Box 202 the accumulated, final estimated time offset.

In box 210, the system 200 utilizes an algorithm to convert FMOP vs. time samples to Phase vs. time, $\phi(t)$. From box 210, the system 200 sends Phase vs. time, $\phi(t)$, to box 240 and proceeds to box 220. In box 220, the system 200 measures the time offset between two otherwise similar signals, using convolution. The location of a peak of the convolution is the relative time offset. If this correction is small, processing of this block may be ended. From box 220, the system 200 sends a time offset correction term, $\Delta t_{off}$ (representing the incremental delay to be added to the total time delay), to accumulator 230.

In accumulator 230, the system 200 successively adds time offset corrections to form an aggregate time offset. The accumulator 230 may add the estimate of the time offset from a prior iteration to the measured time offset correction to form a better estimate of the time offset. Initially, the estimate of the time offset from the prior iteration of the loop may be zero or other constant based on a priori knowledge of system response. From accumulator 230, the system 200 may proceed to box 240. In box 240, the system 200 may delay the desired Phase vs. time signal, $\phi(t)$, by the most recently computed time offset, $t_{off}$, to form a delayed version of the signal, $\phi(t)$. The amount of delay should (eventually) be commensurate with the system delay. From box 240, the system 200 proceeds to system 100 (FIG. 1). System 100 generates measured FMOP vs. time sequence. From system 100, the system 200 proceeds to box 211 (similar to box 210).

In box 211, the system 200 utilizes an-algorithm to convert FMOP vs. time samples to Phase vs. time. The phase vs. (continuous) time signal, derived from the measured FMOP vs. time sequence may differ from the output of box 210 by a time shift, which the system 200 attempts to remove. From box 211, the system 200 proceeds back to box 220.

As shown in FIG. 3, the system 300 estimates, for a desired FMOP vs. time sequence, $\zeta(k)$, a Phase vs. Time signal, $\hat{\phi}(t)$). When processed by the system 100, the Phase vs. Time signal, $\hat{\phi}(t)$), produces the desired $\zeta(k)$. The time offset, $t_{off}$, may be the output of the system 200. Additionally, the system 300 generates a time-based sample sequence, $s(kT_s)$, which may be used to program a Vector Signal Generator to produce an appropriate signal.

Box 301 represents a desired FMOP vs. time sequence, $\zeta(k)$. Box 302 represents an estimate of a time delay, $\zeta(k)$ (from the system 200). The system 300 utilizes, as input, boxes 301, 302, and a desired amplitude envelope for the generated signal.

In box 320, the system 320 converts FMOP vs. time samples to Phase vs. time. From box 320, the system 300 proceeds to box 330. In box 330, the system 300 delays the desired Phase vs. time signal by a time offset (302) computed by the system 200. The output is a Phase vs. Time signal, $\phi(t)$, representing a desired signal. The Phase vs. Time signal, $\phi(t)$, may be derived from the desired FMOP vs. time sequence of box 301, and may have imparted to that sequence a delay, $t_{off}$ (Box 302), which may be commensurate with a system delay. From box 330, the system 300 proceeds to differencer 340.

In the differencer 340, the system 300 compares the desired Phase vs. time signal from box 330 with a measured Phase vs. time signal from a prior loop iteration (box 320). On a first iteration, the differencer 340 may be skipped such that the output is effectively zero. The differencer 340 generates a signal, $\epsilon(t)$, representing the difference between the system measured output and the desired output. For the first loop iteration, $\epsilon(t)$ is taken to be zero. From the differencer 340, the system 300 proceeds to accumulator 350.

In the accumulator 350, the system 300 adds the error, $\epsilon(t)$, from a most recent loop iteration, to the accumulated error, $\Delta\phi(t)$, from the prior loop iteration (initially zero), to generate a better approximation of the accumulated error. From the accumulator 350, the system proceeds to the differencer 360.

In the differencer 360, the system 300 removes the accumulated estimate of the error, $\Delta\phi(t)$, from the desired Phase vs. time signal, $\phi(t)$ (Box 305). The result is a Phase vs. time signal that, when processed by the system 100, produces an iteratively better approximation of the desired FMOP vs. time signal. From the differencer 360, the system 300 proceeds to the system 100 (FIG. 1). System 100 generates the measured FMOP vs. time sequence. From system 100, the system 300 proceeds to box 321, similar to box 320. In box 321, the system 300 converts FMOP vs. time samples to Phase vs. time signal. This signal may differ from Phase vs. time signal, $\phi(t)$ (Box 305) because of distortion imparted by the system 300. From box 321, the system proceeds back to differencer 340.

Box 303 represents the output Phase vs. Time signal, $\hat{\phi}(t)$, from the differencer 360. This output is the desired Phase vs. Time, with the accumulated system error removed. Box 304 represents a Signal Sample Sequence, $s(kT_s)$, from the system 100 used to program a Vector Signal Generator.

In order to provide a context for the various aspects of the present invention, the following discussion is intended to provide a brief, general description of a suitable computing environment in which the various aspects of the present invention may be implemented. While the invention has been described above in the general context of computer-executable instructions of a computer program that runs on a computer, those skilled in the art will recognize that the invention also may be implemented in combination with other program modules.

Generally, program modules include routines, programs, components, data structures, etc. that perform particular tasks or implement particular abstract data types. Moreover, those skilled in the art will appreciate that the inventive methods may be practiced with other computer system configurations, including single-processor or multiprocessor computer systems, minicomputers, mainframe computers, as well as personal computers, hand-held computing devices, microprocessor-based or programmable consumer electronics, and the like. The illustrated aspects of the invention may also be practiced in distributed computing environments where tasks are performed by remote processing devices that are linked through a communications argument model. However, some, if not all aspects of the invention can be practiced on stand-alone computers. In a distributed computing environment, program modules may be located in both local and remote memory storage devices.

An exemplary system for implementing the various aspects of the invention includes a conventional server computer, including a processing unit, a system memory, and a system bus that couples various system components including the system memory to the processing unit. The processing unit may be any of various commercially available processors. Dual microprocessors and other multi-processor architectures also can be used as the processing unit. The system bus may be any of several types of bus structure including a memory bus or memory controller, a peripheral bus, and a local bus using any of a variety of conventional bus architectures. The system memory includes read only memory (ROM) and random access memory (RAM). A basic input/output system (BIOS), containing the basic routines that help to transfer information between elements within the server computer, such as during start-up, is stored in ROM.

The server computer further includes a hard disk drive, a magnetic disk drive, e.g., to read from or write to a removable disk, and an optical disk drive, e.g., for reading a CD-ROM disk or to read from or write to other optical media. The hard disk drive, magnetic disk drive, and optical disk drive are connected to the system bus by a hard disk drive interface, a magnetic disk drive interface, and an optical drive interface, respectively. The drives and their associated computer-readable media provide nonvolatile storage of data, data structures, computer-executable instructions, etc., for the server computer. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment, and further that any such media may contain computer-executable instructions for performing the methods of the present invention.

A number of program modules may be stored in the drives and RAM, including an operating system, one or more application programs, other program modules, and program data. A user may enter commands and information into the server computer through a keyboard and a pointing device, such as a mouse. Other input devices (not shown) may include a microphone, a joystick, a game pad, a satellite dish, a scanner, or the like. These and other input devices are often connected to the processing unit through a serial port interface that is coupled to the system bus, but may be connected by other interfaces, such as a parallel port, a game port or a universal serial bus (USB). A monitor or other type of display device is also connected to the system bus via an interface, such as a video adapter. In addition to the monitor, computers typically include other peripheral output devices (not shown), such as speaker and printers.

The server computer may operate in a networked environment using logical connections to one or more remote computers, such as a remote client computer. The remote computer may be a workstation, a server computer, a router, a peer device or other common network node, and typically includes many or all of the elements described relative to the server computer. The logical connections include a local area network (LAN) and a wide area network (WAN). Such networking environments are commonplace in offices, enterprise-wide computer networks, intranets and the internet.

When used in a LAN networking environment, the server computer is connected to the local network through a network interface or adapter. When used in a WAN networking environment, the server computer typically includes a modem, or is connected to a communications server on the LAN, or has other means for establishing communications over the wide area network, such as the internet. The modem, which may be internal or external, is connected to the system bus via the serial port interface. In a networked environment, program modules depicted relative to the server computer, or portions thereof, may be stored in the remote memory storage device. It will be appreciated that the network connections shown are exemplary and other means of establishing a communications link between the computers may be used.

In accordance with the practices of persons skilled in the art of computer programming, the present invention has been described with reference to acts and symbolic representations of operations that are performed by a computer, such as the server computer, unless otherwise indicated. Such acts and operations are sometimes referred to as being computer-executed. It will be appreciated that the acts and symbolically represented operations include the manipulation by the processing unit of electrical signals representing data bits which causes a resulting transformation or reduction of the electrical signal representation, and the maintenance of data bits at memory locations in the memory system (including the system memory, hard drive, floppy disks, and CD-ROM) to thereby reconfigure or otherwise alter the computer system's operation, as well as other processing of signals. The memory locations where such data bits are maintained are physical locations that have particular electrical, magnetic, or optical properties corresponding to the data bits.

It will be understood that the above description of the present invention is susceptible to various modifications, changes and adaptations, and the same are intended to be comprehended within the meaning and range of equivalents of the appended claims. The presently disclosed embodiments are considered in all respects to be illustrative, and not restrictive. The scope of the invention is indicated by the appended claims, rather than the foregoing description, and all changes that come within the meaning and range of equivalence thereof are intended to be embraced therein.

Having described the invention, I claim:

1. A system for generating a digital signal from input data of a digital pulse, said system comprising:

a converter for converting the digital pulse to an analytic signal, said converter producing a first output by application of an amplitude envelope;

a first generator for generating an analog signal from the first output, said generator producing a second output;

a second generator for generating a third output comprising a time delayed representation of the second output;

a comparator that convolves the second output with the third output to measure a time offset between the second output and the third output; and a refiner for refining the measured time offset by applying an accumulator, said refiner producing a fourth output, the refiner comprising a summer for totaling errors causing the second output to be different than the digital pulse, such that the fourth output represents a cumulative time offset between the second output and the digital pulse;

wherein a time delay applied to the second output to create the third output is equal to a current value of the fourth output.

2. The system as set forth in claim 1 wherein said converter samples the analytic signal resulting in a complex digital sample sequence.

3. A method for generating a digital signal from input data of a digital pulse, said method comprising the steps of:

converting the digital pulse to an analytic signal thereby producing a first output by application of an amplitude envelope;

generating an analog signal from the first output thereby producing a second output;

generating a third output comprising a time delayed representation of the second output;

convolving the second output with the third output to measure a time offset between the second output and the third output; and refining the measured time offset by applying an accumulator to total errors causing the second output to be different than the digital pulse, such that a fourth output represents a cumulative time offset between the second output and the digital pulse;

wherein a time delay applied to the second output to generate the third output is equal to a current value of the fourth output.

4. A computer readable medium encoded with executable instructions for generating a digital signal from input data of a digital pulse, said executable instructions comprising:

a first instruction for converting the digital pulse to an analytic signal thereby producing a first output by application of an amplitude envelope;

a second instruction for generating an analog signal from the first output thereby producing a second output;

a third instruction for generating a third output comprising a time delayed representation of the second output;

a fourth instruction for convolving the second output with the third output to measure a time offset between the second output and the third output;

a fifth instruction for removing perturbations from the second output;

a sixth instruction for refining the measured time offset by applying an accumulator to total errors causing the second output to be different than the digital pulse, such that a fourth output represents a cumulative time offset between the second output and the digital pulse; and a seventh instruction for totaling errors causing the analog signal to be different than the digital pulse;

wherein a time delay applied to the second output to generate the third output is equal to a current value of the fourth output.

5. The computer program product as set forth in claim 4 further including an eighth instruction for sampling the analytic signal resulting in a complex digital sample sequence.

* * * * *